(12) United States Patent
Dujmenovic

(10) Patent No.: US 6,980,787 B1
(45) Date of Patent: Dec. 27, 2005

(54) IMAGE REJECTION MIXING IN WIDEBAND APPLICATIONS

(75) Inventor: Feliks Dujmenovic, Richmond Hill (CA)

(73) Assignee: ATI International Srl, Barbados (KN)

( * ) Notice: Subject to any disclaimer, the term of this patent is extended or adjusted under 35 U.S.C. 154(b) by 405 days.

(21) Appl. No.: 09/669,274

(22) Filed: Sep. 26, 2000

(51) Int. Cl.[7] ............................................. H04B 1/26
(52) U.S. Cl. .................................... 455/318; 455/302
(58) Field of Search ........................... 455/302, 307, 455/306, 311, 326, 333, 295, 296, 317; 327/355, 327/356, 357, 361; 375/319; 331/57

(56) References Cited

U.S. PATENT DOCUMENTS

| | | | | |
|---|---|---|---|---|
| 2,964,622 A | * | 12/1960 | Fire ............................. | 455/302 |
| 5,140,198 A | * | 8/1992 | Atherly et al. ............... | 327/113 |
| 5,180,994 A | * | 1/1993 | Martin et al. ................. | 331/38 |
| 5,239,274 A | * | 8/1993 | Chi ............................... | 331/57 |
| 5,262,735 A | * | 11/1993 | Hashimoto et al. .......... | 331/45 |
| 5,438,301 A | * | 8/1995 | Havens et al. ................ | 331/45 |
| 5,568,099 A | * | 10/1996 | Du ............................... | 331/57 |
| 5,635,879 A | * | 6/1997 | Sutardja et al. ............... | 331/57 |
| 5,659,263 A | * | 8/1997 | Dow et al. .................... | 327/356 |
| 5,870,670 A | * | 2/1999 | Ripley et al. ................. | 455/304 |
| 5,917,383 A | * | 6/1999 | Tso et al. ...................... | 331/57 |
| 6,029,059 A | * | 2/2000 | Bojer ........................... | 455/326 |
| 6,314,279 B1 | * | 11/2001 | Mohindra ..................... | 455/304 |
| 6,324,388 B1 | * | 11/2001 | Souetinov ..................... | 455/302 |

FOREIGN PATENT DOCUMENTS

GB      2 239 143 A    *    6/1991

* cited by examiner

Primary Examiner—Charles N. Appiah
(74) Attorney, Agent, or Firm—Volpe and Koenig, P.C.

(57) ABSTRACT

A ring oscillator produces an in-phase and quadrature phase radio frequency signal. A first mixer mixes the in-phase signal with a received signal. A second mixer mixes the quadrature phase signal with the received signal. A combiner, operatively coupled to the first and second mixers, produces an image cancelled signal.

15 Claims, 2 Drawing Sheets

IMAGE REJECTION MIXING IN WIDEBAND APPLICATIONS

BACKGROUND

This invention generally relates to wideband communication systems. In particular, the invention relates to image suppression in received wideband communications.

Wideband communication systems, such as television and radio communication systems, use a wide frequency spectrum to communicate information. Typically, the wide spectrum is divided into a group of assigned radio frequencies for carrying the information.

In a heterodyne receiver, the received signal is amplified by a radio frequency (RF) amplifier and mixed with an adjustable local oscillator (LO) signal to produce intermediate frequency (IF) signal. One problem with mixer circuits is the generation of image frequency signals.

When two signals are mixed, signal components are produced at the sum and difference of the two signals, and their harmonics. Equation 1 illustrates the potential signal components where $F_{LO}$ is a local oscillator frequency being mixed with a radio frequency, $F_{RF}$ and m and n are integers or zero.

$$\pm mF_{RF} \pm nF_{LO} \qquad \text{Equation 1}$$

Since input circuits typically have limited selectivity in the mixing process, undesired interference may create harmful products, as illustrated by Equation 2. $F_1$ is an undesired interference frequency and m, n and p are an integer or zero.

$$\pm mF_{RF} \pm nF_{LO} \pm pF_1 \qquad \text{Equation 2}$$

For example, when an intermediate frequency signal, $F_{RF}$, is mixed with a local oscillator, $F_{LO}$, the result will produce signals at two frequencies, $F_{LO}+F_{RF}$ and $F_{LO}-F_{RF}$. One of the two signals is the desired frequency and the other is at an undesired frequency. Additionally, based on the quality of the mixers, undesirable harmonics, such as $F_{LO}+2F_{RF}$, could also be produced. In a wideband communication system utilizing multiple frequencies, the frequencies that these undesired signals fall upon may be the same frequency used for another information signal. As a result, the undesired signal produces an image on the desired information signal at that frequency.

One approach to removing the image signal from the desired signal is by filtering. Typically, filtering only reduces the magnitude of the image signal by less than 30 decibels (dB). In some applications, a 30 dB attenuation is not sufficient.

Another approach is to use an image rejection mixer 10, as illustrated in FIG. 1. A received radio frequency signal is input into the image rejection mixer 10. The received signal is input to an in-phase mixer 14 and a quadrature phase mixer 12. A local oscillator (LO) 11 generates a carrier signal. The carrier signal is input into the quadrature phase mixer 12 to produce a demodulated quadrature phase signal and into a 90 degree phase shift device 16, such as a RC-CR circuit, to produce an in-phase carrier. The in-phase carrier is input into the in-phase mixer 14 to produce a demodulated in-phase signal. The demodulated quadrature phase signal is subsequently delayed by a 90 degree phase shift device 22. An adder 20 combines the phase delayed quadrature phase signal to the in-phase signal to produce the desired signal. Typically, the image signal will be out of phase with the desired signal. As a result, the combining cancels the image signal leaving only the desired signal.

To illustrate, $W_{RF}$ is the frequency of the received signal and $W_{LO}$ is the frequency at the local oscillator. The image rejection mixer 10 processes the desired signal as follows. I(t) is the demodulated in-phase signal. Q(t) is the demodulated quadrature phase signal. Q'(t) is the phase delayed quadrature phase signal. O(t) is the subtracted signal.

$$I(t) = \cos(W_{RF}t) * \cos(W_{LO}t) \qquad \text{Equation 3}$$
$$= \frac{1}{2}[\cos(W_{RF} - W_{LO})t + \cos(W_{RF} + W_{LO})t],$$
$$\text{where } W_{RF} - W_{LO} > 0$$

The $\cos(W_{RF}+W_{LO})t$ is removed by low-pass filtering.

$$Q(t) = \cos(W_{RF}t) * \cos\left(W_{LO}t - \frac{\pi}{2}\right) \qquad \text{Equation 4}$$
$$= \frac{1}{2}\cos\left[(W_{RF} - W_{LO})t + \frac{\pi}{2}\right] = -\frac{1}{2}\sin(W_{RF} - W_{LO})t$$

$$Q'(t) = -\frac{1}{2}\sin[(W_{RF}-W_{LO})t - \pi/2] = -\frac{1}{2}\cos(W_{RF}-W_{LO})t \qquad \text{Equation 5}$$

$$O(t) = I(t) + Q'(t) = \cos(W_{RF}-W_{LO})t \qquad \text{Equation 6}$$

The image rejection mixer 10 processes the image signal which is inverted with respect to the desired signal as follows.

$$I(t) = \frac{1}{2}\cos[-(W_{RF}-W_{LO})t] = \frac{1}{2}\cos(W_{RF}-W_{LO})t \qquad \text{Equation 7}$$

$$Q(t) = \frac{1}{2}\cos[-W_{RF}-W_{LO})t + \pi/2] = \frac{1}{2}\sin(W_{RF}-W_{LO})t \qquad \text{Equation 8}$$

$$Q'(t) = \frac{1}{2}\sin[(W_{RF}-W_{LO})t - \pi/2] = -\frac{1}{2}\cos(W_{RF}-W_{LO})t \qquad \text{Equation 9}$$

$$O(t) = I(t) + Q'(t) = \frac{1}{2}\cos(W_{RF}-W_{LO})t - \frac{1}{2}\cos(W_{RF}-W_{LO})$$
$$t = 0 \qquad \text{Equation 10}$$

Accordingly, after image cancellation, the desired signal is recovered, Equation 6, and the image signal is canceled, Equation 10.

Due to variations in the tolerances of the resistors and capacitors in the phase shift device 16 and temperature variations, the phase differential between the carrier and the quadrature carrier may not be maintained at an ideal 90 degrees, degrading performance of the image mixer.

Accordingly, it is desirable to have alternate approaches for image suppression in received wideband signals.

SUMMARY

A ring oscillator produces an in-phase and quadrature phase radio frequency signal. A first mixer mixes the in-phase signal with a received signal. A second mixer mixes the quadrature phase signal with the received signal. A combiner, operatively coupled to the first and second mixers, produces an image cancelled signal.

BRIEF DESCRIPTION OF THE PREFERRED EMBODIMENT(S)

Figure 1:
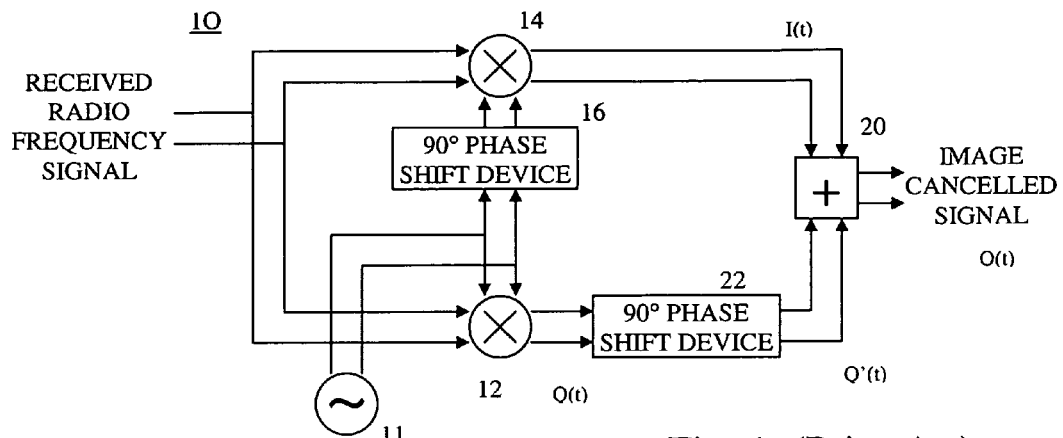
FIG. 1 is an image rejection mixer.
Figure 2:
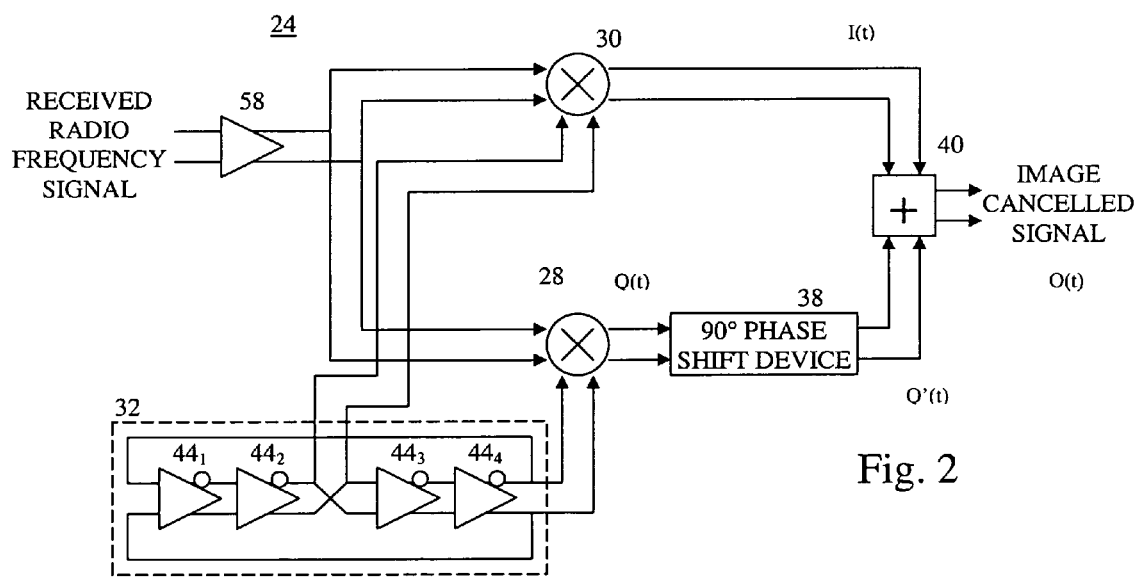
FIG. 2 is an image rejection mixer using a ring oscillator.

FIG. 2 illustrates an image rejection mixer 24 for use in a wideband communication system receiver, such as a television tuner or radio tuner. Although the image rejection mixer 24 is shown using balanced mixers 28, 30, such as a Gilbert cell, other mixers may be used. Balanced mixers are desirable due to their noise suppression quality. A received RF signal is buffered by a buffer 58 so that the RF signal as outputted by the buffer 58 is shifted to a desired level for the in-phase and quadrature mixers 30, 28. The buffered RF signal is inputted into both the in-phase and quadrature phase mixers 30, 28. A ring oscillator 32 produces an in-phase carrier which is input into the in-phase mixer 30 and a quadrature phase carrier which is input to the quadrature phase mixer 28. The demodulated quadrature phase signal is subsequently delayed by a 90° phase delay device 38, such as an RC-CR circuit. The delayed quadrature phase signal is combined using an adder 40 to the in-phase signal to produce the desired signal with the image signal cancelled.

By using the ring oscillator 32, the in-phase and quadrature carrier are maintained at a near ideal 90 degree phase difference. Since the demodulated signals are at low frequencies, a simpler 90 degree phase shift device 38, such as an RC-CR circuit, may be used without degrading the image rejection mixer's performance. Using the ring oscillator 32, a 60 dB attenuation in the image signal is achieved.

One ring oscillator 32 for producing the in-phase and quadrature phase carrier uses four delay cells $44_1$–$44_4$, as shown in FIG. 2. Each delay cell $44_1$–$44_4$ delays the input signal by 45 degrees. As a result, the first delay cell $44_1$ produces a 45 degree phase delay. The second delay cell $44_2$ delays the 45 degree delayed signal by another 45 degrees, totaling 90 degrees. The output of the second delay cell $44_2$ is inverted to shift the phase by 180 degrees prior to being input into the third delay cell $44_3$. The third delay cell $44_3$ delays the 270 degree delayed signal by 45 degrees, totaling 315 degrees. The fourth cell $44_4$ delays the output of the third cell $44_3$ by 45 degrees totaling 360 degrees creating the oscillation. Although the output of the second cell $44_2$ is shown as used for the in-phase carrier and the output of the fourth cell $44_4$ for the quadrature phase carrier, any of the outputs or inputs separated by 90 degrees may be used.

Figure 3:
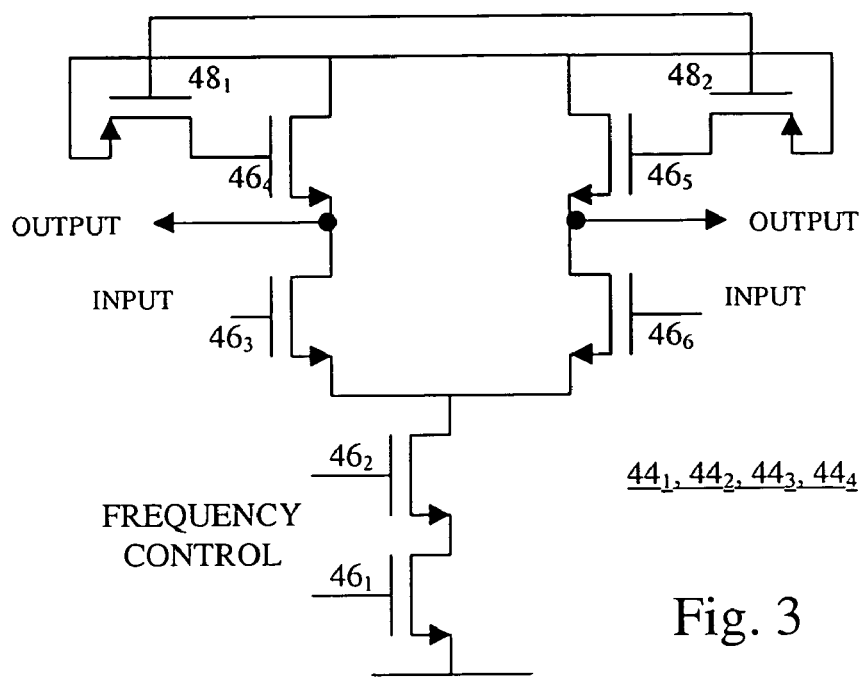
FIG. 3 is a delay cell.

One circuit for use as a delay cell $44_1$–$44_4$ is shown in FIG. 3 using CMOS circuitry. Six n-type MOSFETS $46_1$–$46_6$ and two p-type MOSFETS $48_1$, $48_2$ are configured as shown in FIG. 3. The inputs to the gates of the two bottom n type MOSFETS $46_1$, $46_2$ are connected in series to form the bias, control frequency, to the delay cells $44_1$–$44_4$. The gates of the two lower n type MOSFETS $46_3$, $46_6$ form the input of the delay cells $44_1$–$44_n$. The drains of those MOSFETS $46_3$, $46_6$, form the output. This CMOS circuit produces an output having a phase delayed by 45 degrees from the input.

Figure 4:
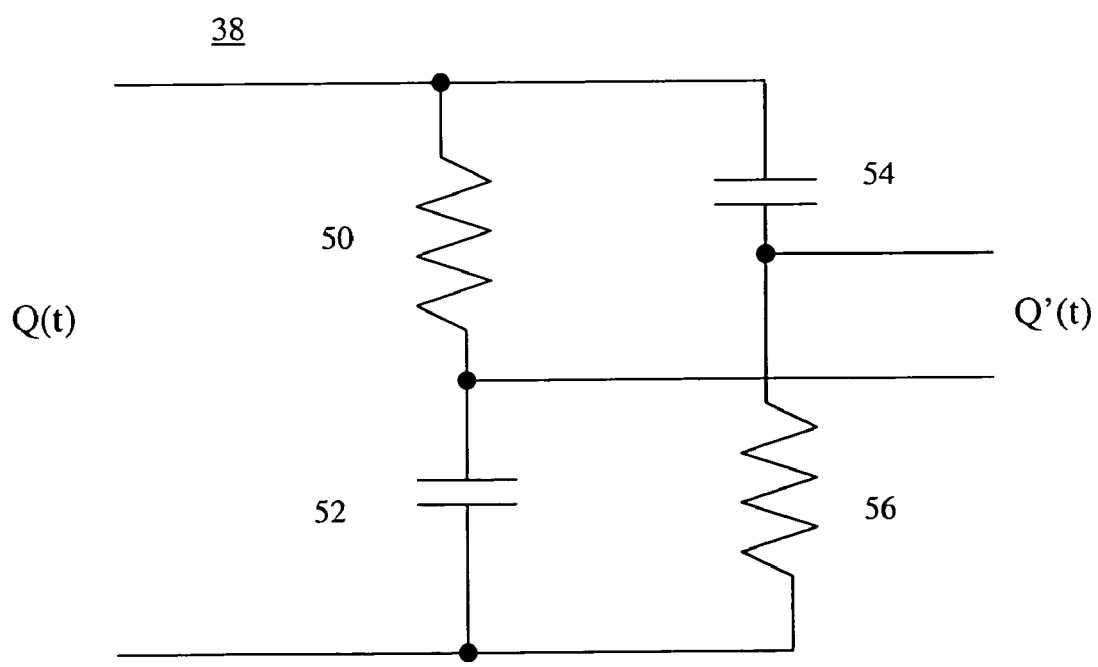
FIG. 4 is a RC-CR circuit.

A simple 90 degree phase shift device 38 may be used for the quadrature phase demodulated signal, such as a RC-CR circuit as shown in FIG. 4. The demodulated quadrature phase signal is input into the delay device 38. The input of the delay device 38 is coupled to a series connected resistor 50 and capacitor 52 connected in parallel to a series connected capacitor 54 and resistor 56. An output of 90 degrees of phase delay is produced at the nodes between the series connected resistors 50, 56 and capacitors 52, 54.

What is claimed is:

1. An apparatus for canceling an image signal from a received radio frequency signal, the apparatus comprising:
a ring oscillator for producing a radio frequency signal having in-phase and quadrature phase components, said ring oscillator including a plurality of delay cells, an output of each delay cell being coupled to an input of another delay cell, one of the couplings between delay cells being cross-coupled so that the output of one delay cell is inverted prior to input into another delay cell;
a first mixer having inputs configured to receive the in-phase component and the received radio frequency signal and outputting an in-phase signal;
a second mixer having inputs configured to receive the quadrature phase component and the received radio frequency signal and outputting a quadrature phase signal;
a phase shift device coupled with one of said mixers for receiving an output of said one mixer and outputting a phase shifted signal; and
a combiner, coupled to the other of said mixers and said phase shift device without a level shift or inverter circuit, for producing an image cancelled signal; and
wherein each of the delay cells comprises gates of two serially connected MOSFETs used for bias and frequency control of that delay cell, gates of two MOSFETs used for an input of that delay cell and drains of two MOSFETs forming the output of the delay cell, the output of the delay cell is delayed by forty-five degrees from the input of the delay cell.

2. The apparatus of claim 1 wherein said phase shift device is coupled to said second mixer.

3. The apparatus of claim 2 wherein said phase shift device shifts a phase of said second mixer output by ninety degrees.

4. The apparatus of claim 1 wherein said ring oscillator includes four delay cells.

5. The apparatus of claim 1 wherein each delay cell delays its input by forty-five degrees.

6. The apparatus of claim 1 wherein said first mixer and said second mixer are Gilbert cells.

7. A receiver for use in a wideband communication system, said receiver capable of canceling an image signal from a received radio frequency signal, said receiver comprising:
a ring oscillator for producing a radio frequency signal having in-phase and quadrature phase components, said ring oscillator including a plurality of delay cells, an output of each delay cell being coupled to an input of another delay cell, one of the couplings between delay cells being cross-coupled so that the output of one delay cell is inverted prior to input into another delay cell;
first mixing means for mixing the in-phase component with the received radio frequency signal and outputting an in-phase signal;
second mixing means for mixing the quadrature phase component with the received radio frequency signal and outputting a quadrature phase signal;
shifting means for receiving one of said mixing means' phase signals and outputting a phase shifted signal; and
combining means for combining the phase shifted signal with the other phase signal to produce an image canceled signal, said combining means coupled to the other of said mixing means and said shifting means without a level shift or inverter circuit; and wherein each of the delay cells comprises gates of two serially connected MOSFETs used for bias and frequency control of that delay cell, gates of two MOSFETs used for an input of that delay cell and drains of two MOSFETs forming the output of the delay cell, the output of the delay cell is delayed by forty-five degrees from the input of the delay cell.

8. The receiver of claim 7 wherein said shifting means shifts the one phase signal by ninety degrees in phase.

9. The receiver of claim 7 wherein said ring oscillator includes four delay cells.

10. The receiver of claim 7 wherein each delay cell delays its input by forty-five degrees.

11. The receiver of claim 7 wherein said shifting means is coupled to said first mixing means.

12. The receiver of claim 7 wherein said first and second mixing means includes a Gilbert cell.

13. A method for canceling an image signal from a received radio frequency signal, comprising the steps of:

providing a ring oscillator including a plurality of delay cells, an output of each delay cell being coupled to an input of another delay cell, one of the couplings between delay cells being cross-coupled so that the output of one delay cell is inverted prior to input into another delay cell;

producing a radio frequency signal having in-phase and quadrature phase components with the ring oscillator;

mixing the in-phase component and the received radio frequency signal by an in-phase mixer to produce an in-phase signal;

mixing the quadrature phase component and the received radio frequency signal by a quadrature phase mixer to produce a quadrature phase signal;

shifting a phase of one of the mixed phase signals by a shifter to produce a phase shifted signal; and combining the phase shifted signal with the other mixed phase signal by a combiner to produce an image canceled signal, wherein the combiner is coupled to the other mixer and the shifter without a level shift or inverter circuit; and wherein each of the delay cells comprises gates of two serially connected MOSFETs used for bias and frequency control of that delay cell, gates of two MOSFETs used for an input of that delay cell and drains of two MOSFETs forming the output of the delay cell, the output of the delay cell is delayed by forty-five degrees from the input of the delay cell.

14. The method of claim 13 wherein the one phase signal is the quadrature phase signal.

15. The method of claim 13 wherein the phase shifting is by ninety degrees in phase.

* * * * *

UNITED STATES PATENT AND TRADEMARK OFFICE
CERTIFICATE OF CORRECTION

PATENT NO. : 6,980,787 B1
APPLICATION NO. : 09/669274
DATED : December 27, 2005
INVENTOR(S) : Feliks Dujmenovic It is certified that error appears in the above-identified patent and that said Letters Patent is hereby corrected as shown below:

At column 2, delete equation 5 and insert

-- $Q'(t) = -\frac{1}{2}\sin[(W_{RF} - W_{LO})t - \pi/2] = \frac{1}{2}\cos(W_{RF} - W_{LO})t$ --.

At column 2, delete equation 8 and insert

-- $Q(t) = -\frac{1}{2}\cos[-(W_{RF} - W_{LO})t + \pi/2] = \frac{1}{2}\sin(W_{RF} - W_{LO})t$ --.

Signed and Sealed this

Tenth Day of June, 2008

JON W. DUDAS
*Director of the United States Patent and Trademark Office*